United States Patent
Ziglioli

(10) Patent No.: US 10,930,581 B2
(45) Date of Patent: Feb. 23, 2021

(54) SEMICONDUCTOR PACKAGE WITH WETTABLE FLANK

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 766 days.

(21) Appl. No.: 15/159,604

(22) Filed: May 19, 2016

(65) Prior Publication Data
US 2017/0338170 A1 Nov. 23, 2017

(51) Int. Cl.
*H01L 23/495* (2006.01)
*H01L 23/31* (2006.01)
(Continued)

(52) U.S. Cl.
CPC .... *H01L 23/49565* (2013.01); *H01L 21/4825* (2013.01); *H01L 21/561* (2013.01); *H01L 21/565* (2013.01); *H01L 21/78* (2013.01); *H01L 23/3107* (2013.01); *H01L 23/3114* (2013.01); *H01L 23/4952* (2013.01); *H01L 23/49503* (2013.01); *H01L 23/49548* (2013.01); *H01L 23/49582* (2013.01); *H01L 21/568* (2013.01);
(Continued)

(58) Field of Classification Search
None
See application file for complete search history.

(56) References Cited

U.S. PATENT DOCUMENTS 6,400,004 B1* 6/2002 Fan ............... H01L 23/3107
257/666
9,177,836 B1 11/2015 Liu et al.
(Continued)

OTHER PUBLICATIONS

Renn et al., "Aerosol Jet® Printing of Conductive Epoxy for 3D Packaging," SMTA Proceedings, May 2, 2014, 7 pages.
(Continued)

*Primary Examiner* — Shaun M Campbell
*Assistant Examiner* — Aneta B Cieslewicz
(74) *Attorney, Agent, or Firm* — Seed IP Law Group LLP

(57) ABSTRACT

Embodiments of the present disclosure are directed to flat no-lead packages with wettable sidewalls or flanks. In particular, wettable conductive layers are formed on the package over lateral portions of the leads and on portions of the package body, which may be encapsulation material. The wettable conductive layers may also be formed on bottom surfaces of the package body and the leads. The wettable conductive layers provide a wettable flank for solder to wick up when the package is mounted to a substrate, such as a PCB, using SMT. In particular, solder that is used to join the PCB and the package wicks up the side of the wettable conductive layers along a side surface of the package. In that regard, the solder is exposed and coupled to the side surface of the package at the wettable conductive layers, thereby allowing for a visual inspection of the solder joints. The wettable conductive layers are formed on the package after the package body has been formed. In one embodiment, the wettable conductive layers are printed on the package body and the leads by Aerosol Jet® technology.

16 Claims, 5 Drawing Sheets

(51) Int. Cl.
  *H01L 21/56*   (2006.01)
  *H01L 21/48*   (2006.01)
  *H01L 21/78*   (2006.01)

(52) U.S. Cl.
  CPC ............ *H01L 2224/48091* (2013.01); *H01L 2224/48247* (2013.01); *H01L 2224/97* (2013.01); *H01L 2924/181* (2013.01)

(56) References Cited

U.S. PATENT DOCUMENTS

| | | |
|---|---|---|
| 2002/0031869 A1 | 3/2002 | Minamio et al. |
| 2005/0029638 A1 | 2/2005 | Ahn et al. |
| 2005/0127494 A1 | 6/2005 | Liu |
| 2005/0189627 A1 | 9/2005 | Ito et al. |
| 2006/0197220 A1 | 9/2006 | Beer |
| 2008/0242004 A1 | 10/2008 | Gulvin et al. |
| 2012/0034760 A1 | 2/2012 | Schuderer et al. |
| 2012/0292755 A1 | 11/2012 | Wang |
| 2014/0134799 A1 | 5/2014 | Daniels et al. |
| 2015/0162310 A1 | 6/2015 | Vincent et al. |
| 2017/0263537 A1* | 9/2017 | Suzuhara ............ H01L 21/4825 |

OTHER PUBLICATIONS

Toscano et al., "A Process for Improved QFN Reliability," SMTA International, Oct. 13, 2013, 4 pages.
Hoerber et al., "Approaches for additive manufacturing of 3D electronic applications,"*Procedia CIRP* 17: 806-811, 2014.

\* cited by examiner

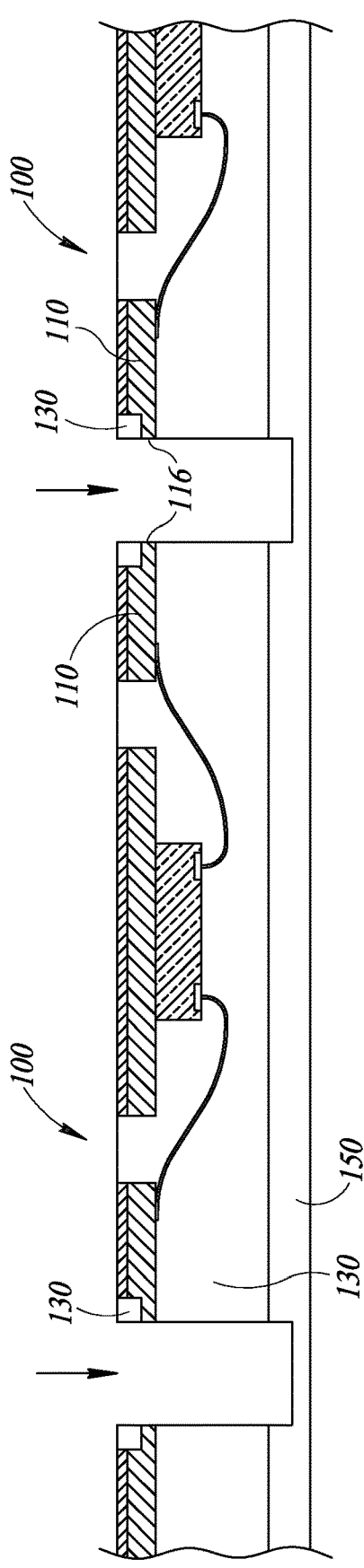
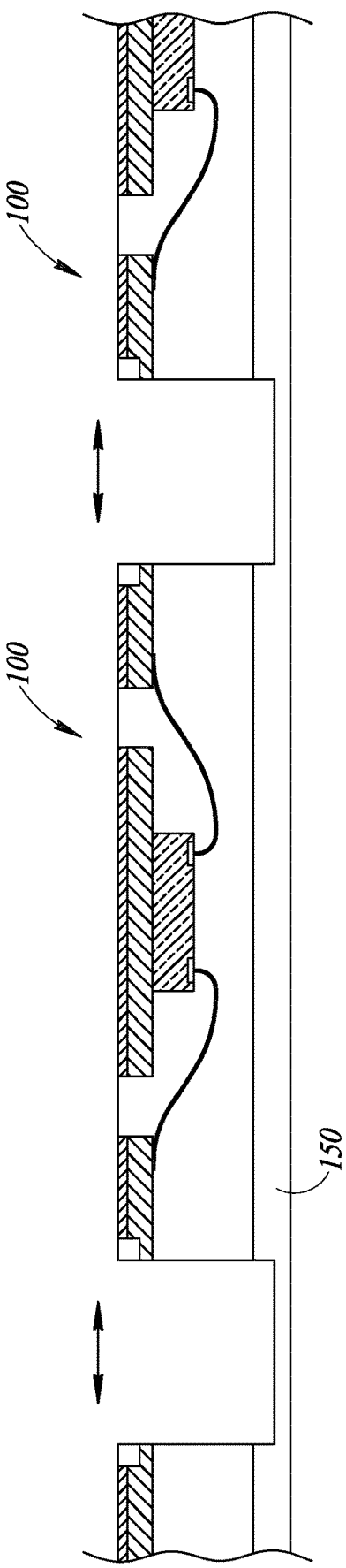

SEMICONDUCTOR PACKAGE WITH WETTABLE FLANK

BACKGROUND

Technical Field

Embodiments of the present disclosure are directed to leadless packages and methods of assembling same.

Description of the Related Art

Flat no-lead packages, such as quad flat no-lead (QFN) packages, are often utilized in applications in which small sized packages are desired. In general, flat no-lead packages provide a near chip scale encapsulated package that includes a planar leadframe. Lands (also referred to as leads) located on a bottom surface of the package and, in many cases, side surfaces of the package provide electrical connection to another device or board, such as a printed circuit board (PCB). In particular, the packages are mounted directly on the surface of the PCB using surface mount technology (SMT).

Although no-lead packages that are mounted using SMT allow for smaller packages, it also creates some disadvantages. In particular, the solder joints between the package and the PCB can be weakened due to the PCB and the package having different coefficients of thermal expansions (CTE). Thus, the reliability of the package may in some cases depend on the integrity of the solder joints.

As packages reduce in size, the available space for solder joints is further limited. Thus, strong solder bonds between the lands of the package and the pads of the board are desired. Furthermore, some applications specify a desire for visual inspection of the solder joints.

BRIEF SUMMARY

Embodiments of the present disclosure are directed to flat no-lead packages with wettable sidewalls or flanks. In particular, wettable conductive layers are formed on the package over lateral portions of the leads and on portions of the package body, which may be encapsulation material. The wettable conductive layers may also be formed on bottom surfaces of the package body and the leads. The wettable conductive layers provide a wettable flank for solder to wick up when the package is mounted to a substrate, such as a PCB, using SMT. In particular, solder that is used to join the PCB and the package wicks up the side of the wettable conductive layers along a side surface of the package. In that regard, the solder is exposed and coupled to the side surface of the package at the wettable conductive layers, thereby allowing for a visual inspection of the solder joints. In various embodiments, the wettable conductive layers are formed on the package after the package body has been formed. In one embodiment, the wettable conductive layers are printed on the package body and the leads by Aerosol Jet® technology.

BRIEF DESCRIPTION OF THE SEVERAL VIEWS OF THE DRAWINGS

FIGS. 3A-3E are cross-section views of various stages of assembly of semiconductor packages in accordance with one embodiment.

DETAILED DESCRIPTION

Figure 1A:
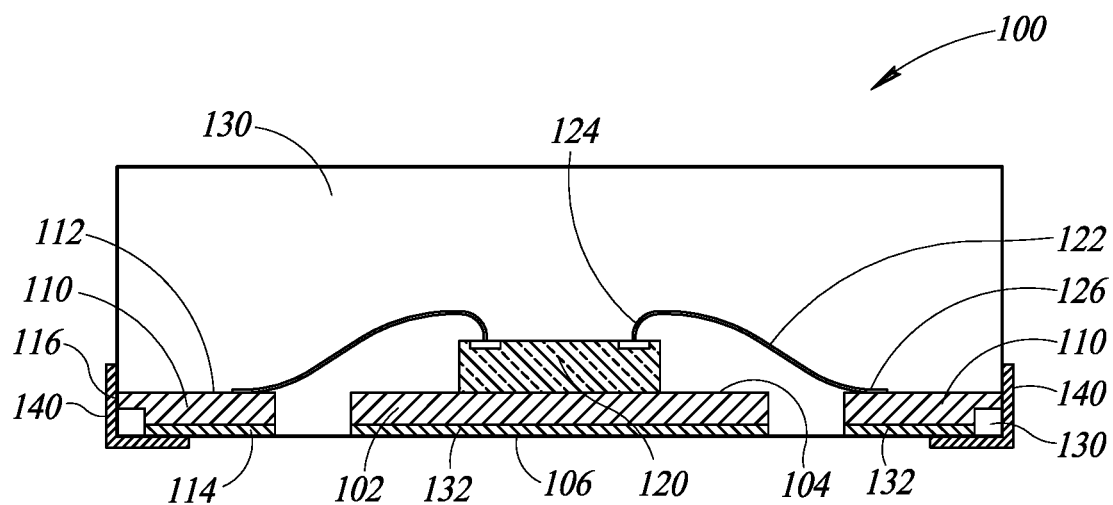
FIG. 1A is a cross-section view of a semiconductor package in paccordance with one embodiment.
Figure 1B:
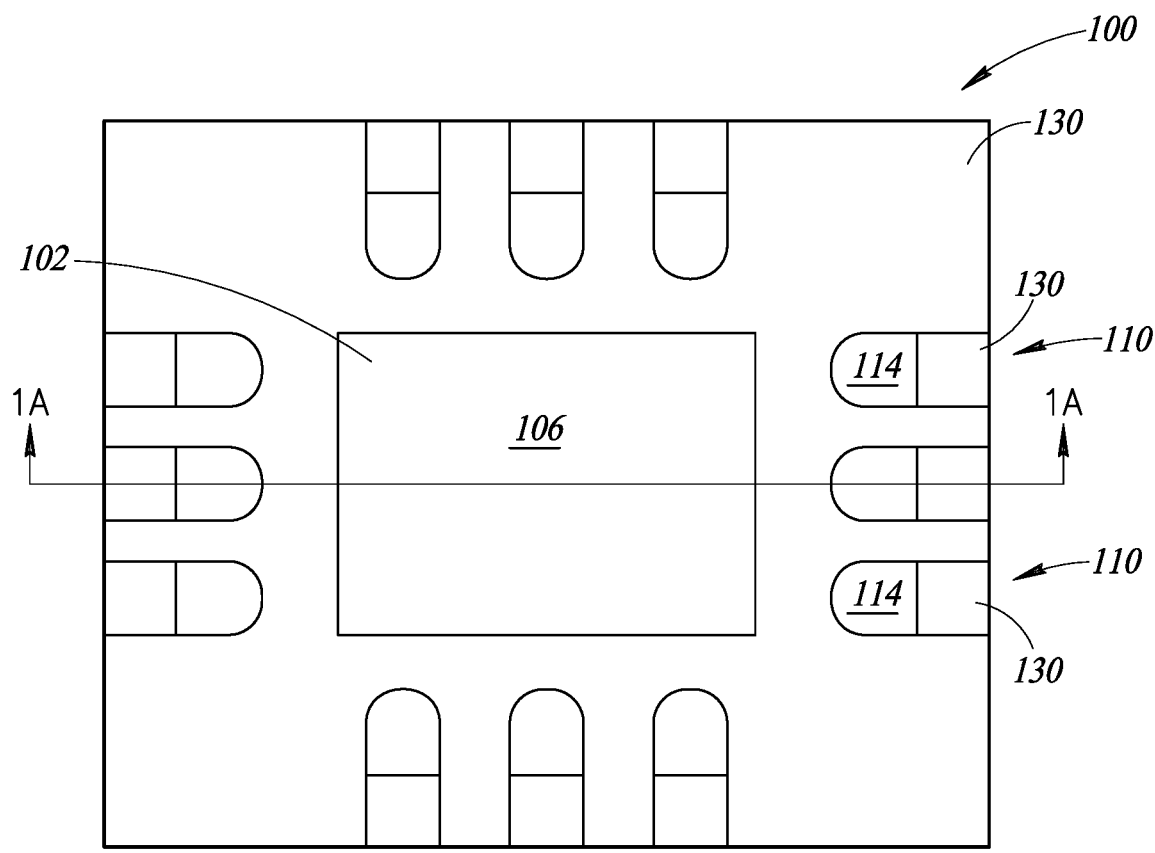
FIG. 1B is a bottom plan view of the semiconductor package of FIG. 1A.

FIG. 1A shows a cross-sectional view of a QFN leadframe package 100 in accordance with one embodiment of the disclosure. FIG. 1B is a bottom plan view of the package 100. The package 100 includes a die pad 102 having inner and outer surfaces 104, 106. The package 100 further includes a plurality of leads 110, each having inner, bottom, and lateral surfaces 112, 114, 116. The die pad 102 and the leads 110 are formed from a leadframe, which is made of conductive material, typically copper or a copper alloy.

The leads 110 are located around the die pad 102 and form a recess at the corners of the package 100 where side surfaces of the package 100 meet with a bottom surface of the package 100. Due to the recess, first portions of the leads 110 proximate the lateral surface 116 of the leads 110 have first thicknesses, while second portions of the leads 110 proximate the bottom surface 114 of the leads 110 have second, different thicknesses. The first thicknesses of the first portions of the leads are less than the second thicknesses of the second portions of the leads, thereby forming the recesses. The bottom surfaces 114 of the leads 110 may be referred to as lands of the package and are configured to electrically couple the package 100 to another device or board, such as a PCB.

As shown in FIG. 1B, the package 100 includes three leads 110 on each side of the package 100. It is to be appreciated, however, that any number of leads may be located on any number of sides of the die pad, including only one lead located on one side of the package.

A semiconductor die 120 that includes one or more electrical components, such as integrated circuits, is secured to the inner surface 104 of the die pad 102 by an adhesive material (not shown). The semiconductor die 120 is made from a semiconductor material, such as silicon, and includes an active surface in which integrated circuits are formed. The integrated circuits may be analog or digital circuits implemented as active devices, passive devices, conductive layers, and dielectric layers formed within the semiconductor die 120 and electrically interconnected according to the electrical design and function of the semiconductor die. The adhesive material may be any material configured to secure the semiconductor die 120 to the die pad 102, such as glue, paste, tape, and the like.

Conductive wires 122 electrically couple the semiconductor die 120 to the leads 110. For instance, a first end 124 of the conductive wire 122 is coupled to a bond pad of the semiconductor die 120 and a second end 126 of the conductive wire 122 is coupled to the lead 110. Although not shown, it will be understood to persons of ordinary skill in the art that in another embodiment, the semiconductor die 120 may be flip chip coupled to the leads 110, as is well known in the art. In that regard, the semiconductor die 120 is mechanically supported by the leads 110 and electrically coupled directly to the leads 110 by solder balls. Thus, in such an embodiment, the package may not include a die pad.

Encapsulation material 130 is located over the die pad 102 and the leads 110 covering the semiconductor die 120 and the conductive wires 122 to form a package body. The encapsulation material 130 is also located between the leads 110 and the die pad 102 and forms a bottom surface of the package along with the outer surface 106 of the die pad 102 and the bottom surfaces 114 of the leads 110. Furthermore, the encapsulation material 130 fills the recesses of the leads 110 at the bottom edges of the package 100. The encapsulation material 130 is an insulative material that protects the electrical components and materials from damage, such as corrosion, physical damage, moisture damage, or other causes of damage to electrical devices and materials. In one embodiment, the encapsulation material is a plastic material, such as a polymer resin.

The bottom surfaces 114 of leads 110 and the outer surface 106 of die pad 102 may include plated conductive layers 132. The plated conductive layers 132 may be a nanolayer or a microlayer of one or more conductive materials. For instance, plated conductive layer is one or more metal materials, such as Ni/Pd/Ag, Ni/Pd/Au—Ag alloy, or Ni/Pd/Au/Ag. The plated conductive layers 132 are made from materials that prevent the leadframe from oxidizing. Although not shown, the inner surfaces 112 of the leads 110 and inner surface 104 of the die pad 102 may include plated conductive layers as well.

Wettable conductive layers 140 are located at the corners of the package 100 over the encapsulation material 130 and exposed surfaces of the leads 110, such as the bottom surfaces 114 and the lateral surfaces 116. In particular, each of the wettable conductive layers 140 covers portions of the lateral and bottom surfaces 116, 114 of the leads 110 and the encapsulation material 130 therebetween. In one embodiment, the wettable conductive layers 140 cover the entire lateral surfaces 116 and/or bottom surfaces 114 of the leads 110. In the illustrative embodiment, the wettable conductive layers 140 extend beyond the lateral surfaces 116 of the leads 110 onto the encapsulation material 130 above the lead 110 to provide a larger surface area for joining material, such as solder, to wick up, as will be explained below.

The wettable conductive layers 140 may be a nanolayer or a microlayer of one or more conductive materials. In particular, the wettable conductive layers 140 are made of any conductive material that provides a wettable surface for a joining material, such as solder, used during surface mounting of the package 100 to another device or board. More particularly, the wettable conductive layers 140 enable solder to flow up the wettable conductive layers 140 on the side surface of package 100, thereby improving the solder joint between the package 100 and the board. In one embodiment, the wettable conductive layers 140 are formed from one or more metal materials, such as gold, platinum, silver, nickel, or aluminum.

The dimensions, such as the thickness, of the wettable conductive layer 140 may be any dimension suitable for providing a wettable surface for the solder. In one embodiment, the thickness of the wettable conductive layer 140 is between 1.5 microns to 4 microns. However, it is to be appreciated that greater thicknesses, such as between 4 and 10 microns, may be used. The width of the wettable conductive layer 140 may be substantially the same width as the leads 110 as in shown in FIG. 1B or may be greater or less than the width of the leads 110.

Figure 2:
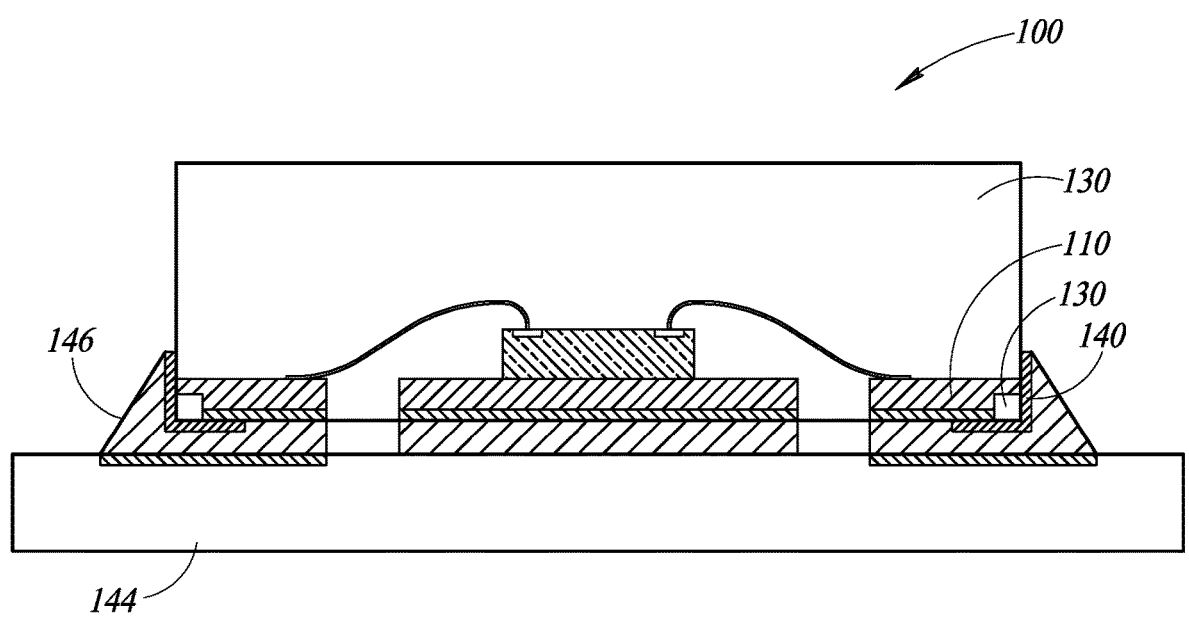
FIG. 2 is a cross-section view of the semiconductor package of FIG. 1A attached to a printed circuit board.

FIG. 2 is a cross-section illustration of the package 100 of FIG. 1A coupled to a printed circuit board (PCB) 144 by solder joints 146. Although the details are of the PCB 144 are not shown, it will be understood that the PCB 144 includes one or more layers of insulative and conductive materials, as is well known in the art.

As shown in FIG. 2, the wettable conductive layers 140 are wettable flanks for the joining material, such as solder, of the solder joints 146 to wick up the side of the package 100 when the package 100 is mounted to PCB 144. In particular, FIG. 2 illustrates that solder of the solder joints 146 has wicked up the side of the wettable conductive layers 140 located on the lateral surface 116 of the leads 110 and the encapsulation material 130. With a portion of the solder joint 146 adhering to the package 100 at its side surface, a visual inspection of the solder joint 146 between the package 100 and the PCB 144 is thereby readily enabled. That is, due to the wettable conductive layer 140 being higher on the side of package and thus farther from the PCB 144, an inspector has more surface area along the side surface of the package 100 to inspect the solder joint 146. Thus, not only is the surface area for joining the package 100 to the PCB 144 greater thereby increasing the mechanical and electrical connection between the leads 110 and the PCB 144, but also a visual inspection of the solder joint 146 may be more easily completed than over the prior art.

FIGS. 3A-3E are cross-section views of various stages of assembly of semiconductor packages, such as the semiconductor package 100 of FIGS. 1A and 1B, in accordance with one embodiment.

Figure 3A:
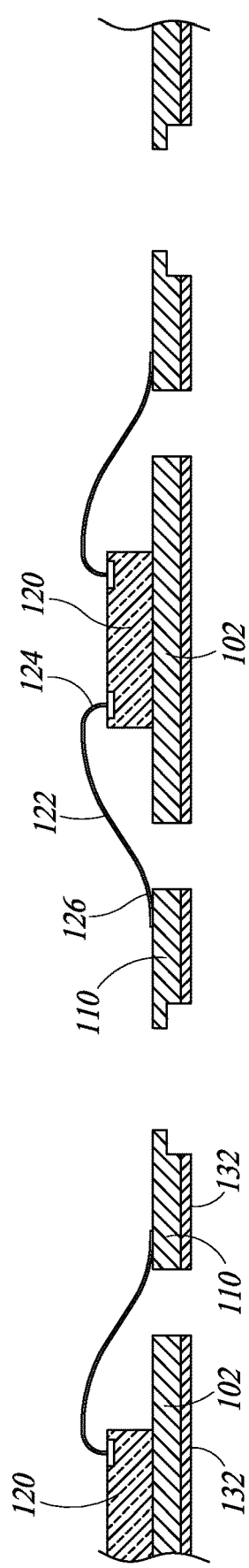

As shown in FIG. 3A, semiconductor dice 120 are coupled to die pads 102 of a leadframe strip or array. Although not shown, the leadframe strip or array includes connecting bars that couple the various components, such as the leads 110 and the die pads 102, of the leadframe strip or array together. The leadframe strip or array may include pre-plated conductive layers 132 on the leads 110 and the die pads 102 of the leadframe strip.

The semiconductor dice 120 may be coupled by placing adhesive material, such as glue, paste, or tape, on one or both of the semiconductor dice 120 and the die pads 102 and coupling the semiconductor dice 120 to the die pads 102. Furthermore, the semiconductor dice 120 are electrically coupled to the leads 110 by coupling first ends 124 of conductive wires 122 to bond pads of the semiconductor dice 120 and second ends 126 of the conductive wires 122 are coupled to the leads 110.

Figure 3B:
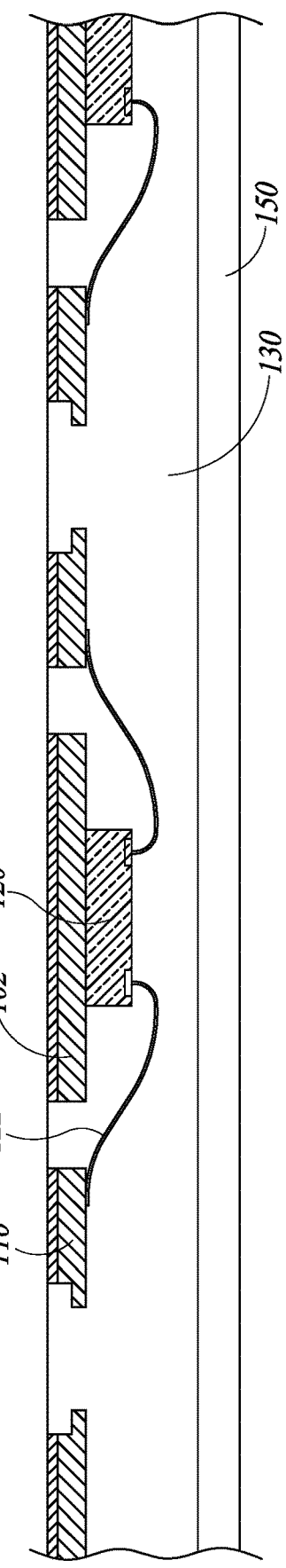

As shown in FIG. 3B, encapsulation material 130 is formed around the semiconductor dice 120 and conductive wires 122 and over the leads 110 and die pads 102. The encapsulation material 130 is formed by conventional techniques, which may be a molding process. For instance, the molding process may include injecting a molding material, such as a resin molding compound, into a mold. The molding material is hardened, which may involve a curing step. Upon hardening the encapsulation material 130, the encapsulation material 130 may be placed on a flexible substrate, such as tape 150.

As shown in FIG. 3C, after the encapsulation material 130 has been placed on the tape 150, the packages are singulated into individual packages 100. In particular, the packages 100 are singulated by cutting through the encapsulation material 130 between adjacent leads 110 as indicated by the arrows. The first portions of the leads 110 are also cut to ensure that the lateral surfaces 116 of the leads 110 are exposed from the encapsulation material 130 at side surfaces of the package 100. The singulation does not extend through the tape 150.

The singulation process may include any suitable techniques, such as sawing or laser cutting, for separating the packages into individual packages. In a sawing process, a saw blade used to cut through the encapsulation material 130 and leads 110 will have a width that is greater than the width of the encapsulation material 130 between adjacent leads 110 of adjacent packages to ensure that first portions of the leads 110 are also cut to expose the lateral surfaces 116 of the leads 110.

It is to be appreciated that by having encapsulation material 130 surrounding the first portions (the thinner portions) of the leads 110, the singulation process may be improved. First of all, cutting through encapsulation material 130 is substantially easier than cutting through the leadframe material, which as mentioned above is typically copper or a copper alloy. Thus, by cutting through smaller thicknesses of first portions of the leads 110, rather than the larger thicknesses of the second portions of the leads 110, the blade life of the sawing process may be lengthened. Additionally, the throughput through the saws is also improved in that the sawing speed may be increased.

Furthermore, by not cutting through leads that extend to the corner edge of the package, saw burrs may be reduced or eliminated. Typically, when sawing through leads that extend to the corner edge of the package, saw burrs can form that extend beyond the bottom surface of the package. The saw burrs that extend beyond the bottom of the package can cause difficulties during surface mount, creating voids in the solder joints. By cutting through encapsulation material on both sides of the leads, saw burs are substantially eliminated or significantly reduced. Thus, the singulation process may be more efficient and less costly than in the prior art.

As shown in FIG. 3D, the tape 150 may be stretched to further separate the individual packages 100 apart from each other as indicated by the arrows.

Figure 3E:
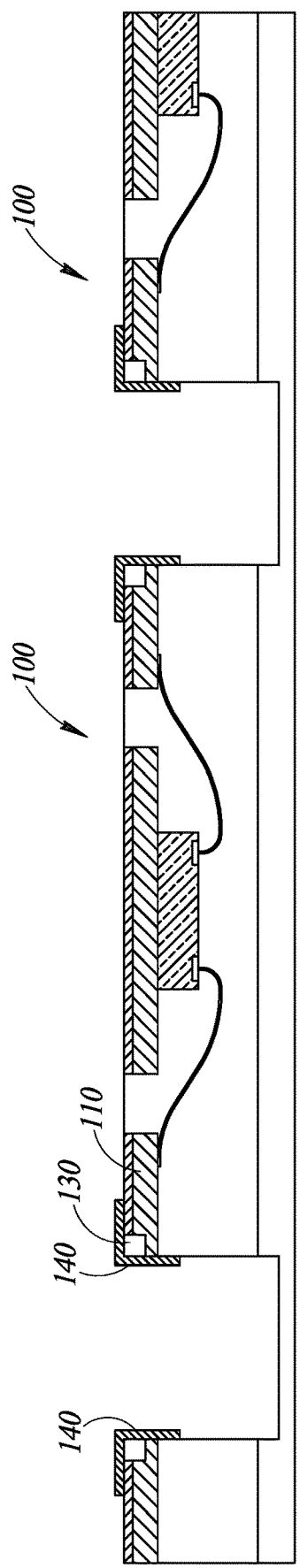

As shown in FIG. 3E, the wettable conductive layers 140 are formed on the packages 100. In particular, the wettable conductive layers 140 are printed on the side and bottom surfaces of the packages 100. More particularly, the wettable conductive layers 140 are printed on the lateral surfaces 116 of the leads 110, the bottom surfaces 114 of the leads 110, and the encapsulation material 130 between the lateral surfaces 116 and bottom surfaces 114 of the leads 110. In the illustrated embodiment, the wettable conductive layers 140 extend beyond lateral surfaces 116 of the leads 110 onto the encapsulation material 130 above the lateral surface 116 of the leads 110. This provides a greater wettable surface area than is provided by lateral surfaces 116 of the leads 110. As mentioned above, the wettable conductive layers 140 provide a wettable surface for solder to wick up during surface mount of the package 100 to another device or board.

The wettable conductive layers 140 are printed by ink printing technology, such as Aerosol Jet® technology, which is a maskless and contactless direct printing technology that can produce features with small dimensions. Aerosol Jet® technology allows for precisely deposited conductive materials with small dimensions. Generally described, Aerosol Jet® technology involves a conductive ink that is atomized. Aerosol and the atomized ink are provided to an impactor. In the impactor, the ink is densified and provided to a printing nozzle to print onto one or more surfaces. The conductive ink is printed through a nozzle onto package 100 to form the wettable conductive layer 140. The conductive ink may be printed at the edge of the package in a single printing step such that the conductive ink is printed on the side surface of the package and the bottom surface of the package in the same step. The printed conductive ink forms the wettable conductive layers 140 described above. After printing the conductive ink, the package 100 is complete and may be removed from the tape 150 for mounting to another device or PCB as shown in FIG. 2.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
   a die pad;
   a semiconductor die coupled to the die pad;
   a lead spaced from the die pad and having a first thickness and a second thickness, the second thickness being greater than the first thickness, a bottom surface of the lead including a plating layer, wherein the lead includes a recess;
   a conductive wire, the semiconductor die being electrically coupled to the lead by the conductive wire;
   encapsulation material around the semiconductor die and the conductive wire and over the die pad and the lead, the encapsulation material filling the recess wherein a lateral surface and the plating layer at the bottom surface of the lead remains exposed by the encapsulation material; and
   a wettable conductive layer located on the lateral surface of the lead, only a portion of the plating layer, and the encapsulation material that fills the recess.

2. The semiconductor package of claim 1, wherein the plating layer at the bottom surface of the lead is coplanar with the portion of the encapsulation material that fills the recess.

3. The semiconductor package of claim 1, wherein the wettable conductive layer has a thickness that is between 1.5 microns to 50 microns.

4. The semiconductor package of claim 1, further comprising:
   a plurality of leads spaced from the die pad, each of the plurality of leads having a first thickness and a second thickness, the second thickness being greater than the first thickness;
   a plurality of conductive wires, the semiconductor die being electrically coupled to the plurality of leads by the conductive wires, respectively;
   wherein the encapsulation material is around the plurality of conductive wires and over the plurality of leads, wherein lateral surfaces and bottom surfaces of the leads remain exposed by the encapsulation material; and
   a plurality of wettable conductive layers, each located on the lateral surfaces of the plurality of leads and portions of the encapsulation material between the lateral surfaces and bottom surfaces of the leads.

5. The semiconductor package of claim 1, the wettable conductive layer is located on the encapsulation material above and below the lateral surface of the lead.

6. An electronic device comprising:
   a printed circuit board having contact pads;
   joining material located on each of the contact pads; and
   a semiconductor package mounted to the printed circuit board by the joining material, the semiconductor package including:

a semiconductor die electrically coupled to a plurality of leads, each of the plurality of leads having a respective recess, bottom surfaces of the plurality of leads including a plating layer;

encapsulation material around the semiconductor die and over the plurality of leads, wherein lateral surfaces of the leads remain exposed and form at least one coplanar surface with the encapsulation material, wherein the encapsulation material fills the recesses; and wettable conductive layers located on the at least one coplanar surface formed by the lateral surfaces of the plurality of leads and the encapsulation material, the wettable conductive layers located on only a portion of the plating layer at the bottom surfaces of the plurality of leads, wherein the wettable conductive layers cover the encapsulation material that fills the recesses, respectively.

7. The electronic device of claim 6, wherein the wettable conductive layers extend above the lateral surfaces of the plurality of leads onto the encapsulation material.

8. The electronic device of claim 6, the wettable conductive layers are located at an edge of the package having first portions on the lateral surfaces of the plurality of leads, second portions on the plating layers on the bottom surfaces of the plurality leads, and third portions on the encapsulation material between the lateral surfaces and bottom surfaces of the plurality of leads.

9. The electronic device of claim 6, wherein the joining material is solder.

10. The electronic device of claim 6, comprising conductive wires, wherein the conductive wires electrically couple the semiconductor die to the plurality of leads.

11. A semiconductor package comprising:
a die pad;
a semiconductor die coupled to the die pad;
a lead spaced from the die pad, the lead having a lateral surface and a bottom surface, the lead having a recess between the lateral and bottom surfaces, a plating layer on the bottom surface of the lead;
a conductive wire, wherein the semiconductor die is electrically coupled to the lead by the conductive wire;
encapsulation material over the semiconductor die and the conductive wire and over portions of the die pad and the lead, wherein the encapsulation material fills the recess of the lead; and
a wettable conductive layer located on the lateral surface of the lead, only a portion of the plating layer at the bottom surface of the lead, and the wettable conductive layer covers the encapsulation material filling the recess.

12. The semiconductor package of claim 11, wherein the wettable conductive layer extends beyond the lateral surface of the lead and onto a surface of the encapsulation material.

13. The semiconductor package of claim 11, wherein the wettable conductive layer has a thickness that is between 1.5 microns to 4 microns.

14. The semiconductor package of claim 11, wherein the wettable conductive layer is a metal material.

15. The semiconductor package of claim 11, wherein the wettable conductive layer covers the entire lateral surface of the lead.

16. The semiconductor package of claim 11, wherein the encapsulation material is a polymer resin.

* * * * *